United States Patent [19]

Fielder et al.

[11] Patent Number: 4,820,397
[45] Date of Patent: Apr. 11, 1989

[54] QUICK CHANGE SPUTTER TARGET ASSEMBLY

[75] Inventors: Kenneth B. Fielder; Robert L. Belli, both of Columbus; Conrad E. Fuchs, Grove City, all of Ohio

[73] Assignee: Tosoh SMD, Inc., Grove City, Ohio

[21] Appl. No.: 176,911

[22] Filed: Apr. 4, 1988

[51] Int. Cl.$^4$ ............................................. C23C 14/34
[52] U.S. Cl. .................................................... 204/298
[58] Field of Search ................... 204/298 SG, 298 TS, 204/298 CS

[56] References Cited

U.S. PATENT DOCUMENTS

| | | | |
|---|---|---|---|
| 4,204,936 | 5/1980 | Hartsough | 204/192.12 |
| 4,385,979 | 5/1983 | Pierce et al. | 204/298 |
| 4,457,825 | 7/1984 | Lamont, Jr. | 204/298 |
| 4,564,435 | 1/1986 | Wickersham | 204/298 |
| 4,657,654 | 4/1987 | Mintz | 204/298 |
| 4,668,373 | 5/1987 | Rille et al. | 204/298 |

Primary Examiner—Aaron Weisstuch
Attorney, Agent, or Firm—Biebel, French & Nauman

[57] ABSTRACT

A sputter source of the type which relies on thermal expansion of an annular sputter target to make good physical contact with a peripheral cooling wall is disclosed. Novel means are provided for holding the sputter target in place in the source when the source and target are at ambient temperature. In a preferred embodiment of the invention the holding means comprises spring means which cooperate with a groove in either an inner or outer rim of the sputter target. By the application of a sufficient axial force on the target, the gripping force of the spring means is overcome and the target can be removed or inserted. Also shown is a structure which can be used to retrofit the novel quick change target into an existing sputter source.

12 Claims, 2 Drawing Sheets

QUICK CHANGE SPUTTER TARGET ASSEMBLY

BACKGROUND OF THE INVENTION

Sputtering, as a means to deposit thin films of a desired material on a substrate, is an old art which has become very important in the manufacture of semiconductor devices such as integrated circuits. In a sputtering system material to be deposited on the substrate is removed from a sputter target by bombardment of the target with ions. However, ion bombardment not only causes atoms or molecules of the target material to be ejected from the target, it also imparts thermal energy to the target.

Normally, a sputtering system comprises a sputter source, a vacuum chamber, and means for positioning and holding the substrate in proximity to the sputter source. A modern sputter source normally comprises a target from which material is to be sputtered, means for holding the target in place, means for creating a plasma in the vicinity of the target, means for causing ions in the plasma to bombard the target, and means for cooling the target to prevent overheating.

Various means have been used in the past for holding sputter targets in place in sputter sources. Such holding means must ensure that the target maintains good thermal contact with the cooling means. In a vacuum environment this generally requires good physical contact. On the other hand, sputter targets must be replaced from time to time as the target material is removed and the target is eroded away. Moreover, in certain research applications there is the need for frequent target changes so that experiments can proceed with different materials.

The time required to replace a sputter target and the method of replacement are often significant considerations to users of sputtering systems. The semiconductor manufacturing industry is particularly sensitive to equipment "down-time", (i.e., the time a piece of production equipment is unavailable) because of the disruptive and costly effects it can have on an entire semiconductor fabrication line. Similarly, the method of target replacement should minimize the introduction of foreign material into the sputtering system's vacuum chamber to avoid possible contamination problems with the substrate.

In some prior art sputter sources, particularly in sputter sources designed to use planar targets, the sputter target is physically soldered to a cooling plate. While this ensures good thermal contact, it makes replacement of the target a difficult and time-consuming problem. In other designs, targets are physically bolted to a cooling means. While this makes target replacement somewhat easier, the thermal contact is not as good. There is a class of sputter sources having annular targets in which target cooling is accomplished by thermal contact between an outer rim of the target and a peripheral cooling wall. In such sources, good thermal contact is maintained between the target rim and the cooling wall by thermal expansion of the target. Examples of such sources are shown in U.S. Pat. Nos. 4,100,055, 4,385,979, 4,457,825 and 4,657,654. When a sputter source of this type is at ambient temperature the target is slightly smaller in diameter than the cooling wall, and the target moves freely in an axial direction. This makes target replacement much easier than in the types of sputter sources described in the preceding paragraph. However, when the source is in operation and heats, the target expands into good physical and thermal contact with the cooling wall.

For a variety of reasons, sputter sources are often operated in a vertical or inverted orientation. To operate in such postures, sputter sources which rely on target expansion to provide good physical contact with a cooling wall require an additional holding means to maintain the sputter target in its proper position when the source is at ambient temperature. In the past, the additional holding means utilized have involved structures which must be screwed and unscrewed each time a target is changed. These prior art structures make sputter target changing a longer, more complex process than is desired.

One prior art solution to address the length of time it takes to change targets is shown in U.S. Pat. No. 4,657,654 in which the additional target holding means comprises pins, mounted at the outer rim of the target, which cooperate with holding slots. One disadvantage of this approach is the fact that target fabrication becomes more expensive and complex due to the need to securely mount the pins, which are made of a different material than the sputter target, into the target material. The pin mounting must remain secure notwithstanding repeated temperature cycling of the system.

Accordingly, it is an object of this invention to make it possible to quickly and easily change sputter targets in a sputter source of the type which relies on thermal expansion of an annular sputter target to provide physical contact with a peripheral cooling wall.

Another object of this invention is to provide a quick change sputter target and source structure which minimizes the risk of contamination of the sputter system vacuum chamber.

Yet another object of this invention is to provide a quick change target and source structure which can be easily retrofitted into existing sputtering systems.

Still another object of this invention is to provide a quick change target structure which can be used in a sputter source of the type described in U.S. Pat. No. 4,457,825.

SUMMARY OF THE INVENTION

The present invention is directed to a sputter source of the type which relies on thermal expansion of an annular sputter target to make good physical contact with a peripheral cooling wall. Novel means are provided for holding the sputter target in place in the source when the source and target are at ambient temperature. In a preferred embodiment of the invention the holding means comprises spring means which cooperate with a groove in either an inner or outer rim of the sputter target. By the application of a sufficient axial force on the target, the gripping force of the spring means is overcome and the target can be removed or inserted.

Also shown is a structure which can be used to retrofit the novel quick change target into an existing sputter source of the type disclosed in the applicant's U.S. Pat. No. 4,457,825 and which is sold commercially under the trademark "ConMag ®".

DETAILED DESCRIPTION

Figure 1:
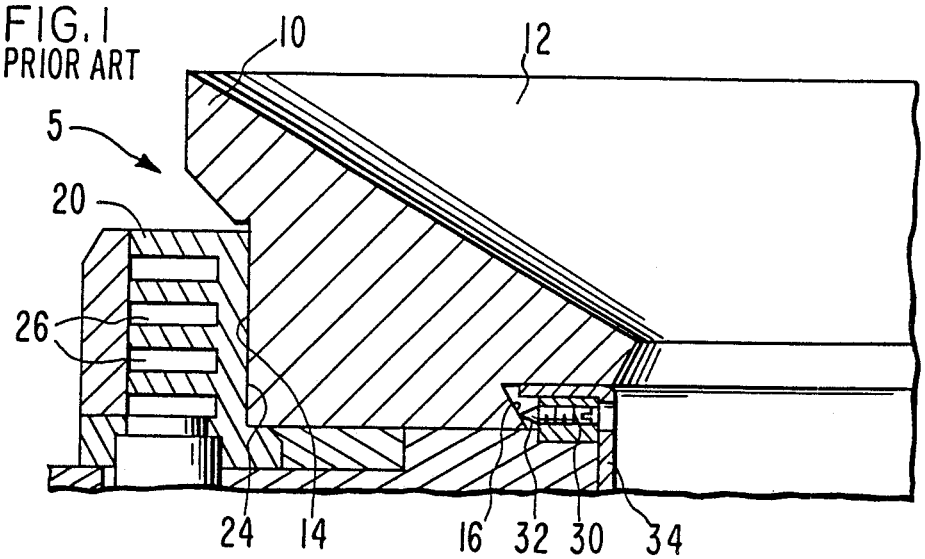
FIG. 1 is a partial section of a prior art sputtering source.

FIG. 1 shows a partial section of a prior art magnetron sputter source 5 of the type disclosed in U.S. Pat. No. 4,457,825 and sold commercially under the trademark "ConMag ®". Sputter source 5 comprises a sputter target 10 having a face 12 from which a desired material such as aluminum is sputtered to form a thin film on a substrate such as a semiconductor wafer. Sputter target 10 has an outer rim 14 adjacent to a target cooling structure 20. Target cooling structure 20 comprises a cooling wall 24 for contacting sputter target 10 and plurality of channels 26 for circulating a cooling fluid, typically water.

When target 10 and the remainder of sputter source 5 are at ambient temperature, i.e., substantially below their operating temperature, there is a sufficient gap (not shown) between target outer rim 14 and cooling wall 24 to allow the target to move freely in the axial direction. However, when the sputter source 5 is in operation ion bombardment of the sputter target 12 imparts thermal energy to the target 10 causing it to expand, so that target outer rim 14 makes good physical and thermal contact with the cooling wall 24. Once good thermal contact between the target 10 and the cooling structure 20 has been attained, the temperature of the target can be maintained by adjusting the flow and temperature of the cooling fluid through channels 26.

Target 10 must be properly and precisely dimensioned so that it meets the criteria of providing a gap when at ambient temperature but good physical contact when heated to operating temperature. Care must be taken to ensure that thermal expansion of the target does not cause too much force between target outer rim 14 and cooling wall 24 or there may be adverse effects such as target cracking. Where the material to be sputtered has either a very low or very high coefficient of expansion, or is too fragile to withstand the force necessary to provide good thermal contact, a target assembly structure such as is disclosed in U.S. Pat. No. 4,385,979 may be employed.

Sputtering sources such of the type shown in FIG. 1 are typically operated in a vertical orientation. Accordingly, it is necessary to hold the target in place while it is at ambient temperature. As shown in FIG. 1, in the prior art this was accomplished by using a plurality of set screws 30 which grip an inner rim 16 of the sputter target 10. Inner rim 16 may be sloped as is shown in FIG. 1, or may contain a V-groove similar to V-groove 118 shown in FIG. 3, to prevent axial movement of the target 10 when the set screws 30 are tightened. When using a V-groove the V-groove is positioned to accept the tips 32 of set screws 30. To avoid unwanted erosion and film contamination, set screws 30 are shielded from ion bombardment by a combination of the overlap of sputter target face 12 and shield 34.

In prior art sputter sources of the type shown in FIG. 1, target replacement requires removal of set screws 30. Removal of these set screws, which number six (No. 4-40) in the commercial configuration of the ConMag ® sputter source, is a relatively time consuming process. Moreover, occasionally the set screws 30 gall, causing additional delays in the target replacement process.

Figure 2:
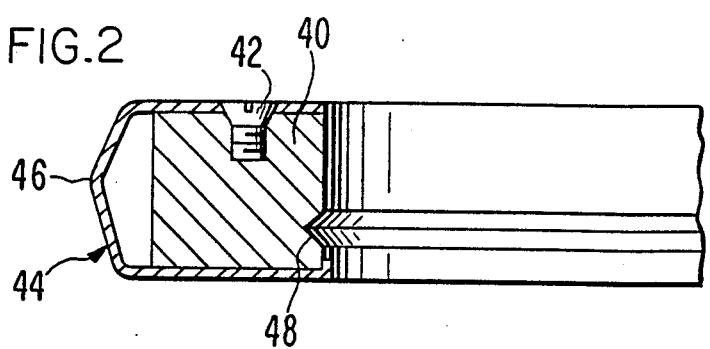
FIG. 2 is a partial section of a ring structure according to the present invention which can be used to retro

FIG. 2 shows an adapter ring 40 for retrofitting the present invention into a prior art sputter source of the type shown in FIG. 1. Adapter ring 40 is mounted in the sputter source 5 by using the existing set screws 30. Set screws 30 are tightened to securely fit within V-groove 48. Thus, in this embodiment set screws 30 now hold adapter ring 40 rather than inner target rim 16. At the outer periphery of adapter ring 40 are a plurality of springs 44 each of which comprises a protrusion 46. Each spring 44 is mounted on adapter ring 40 by a screw 42.

Figure 3:
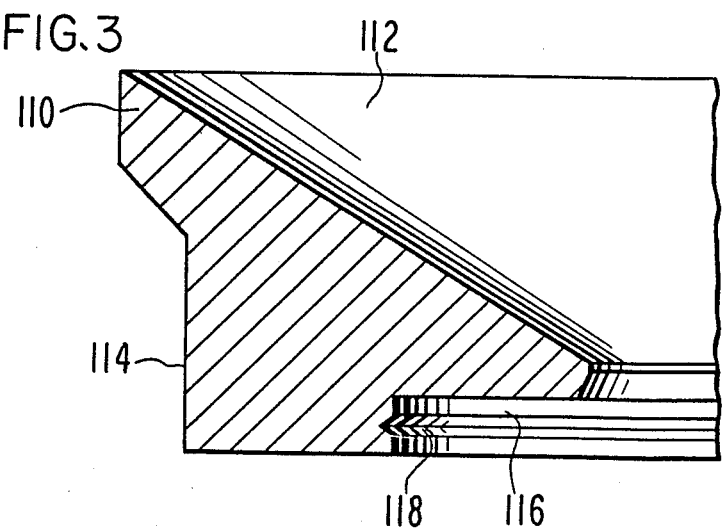
- FIG. 3 is a partial section of a sputter target used in the present invention.
Figure 4:
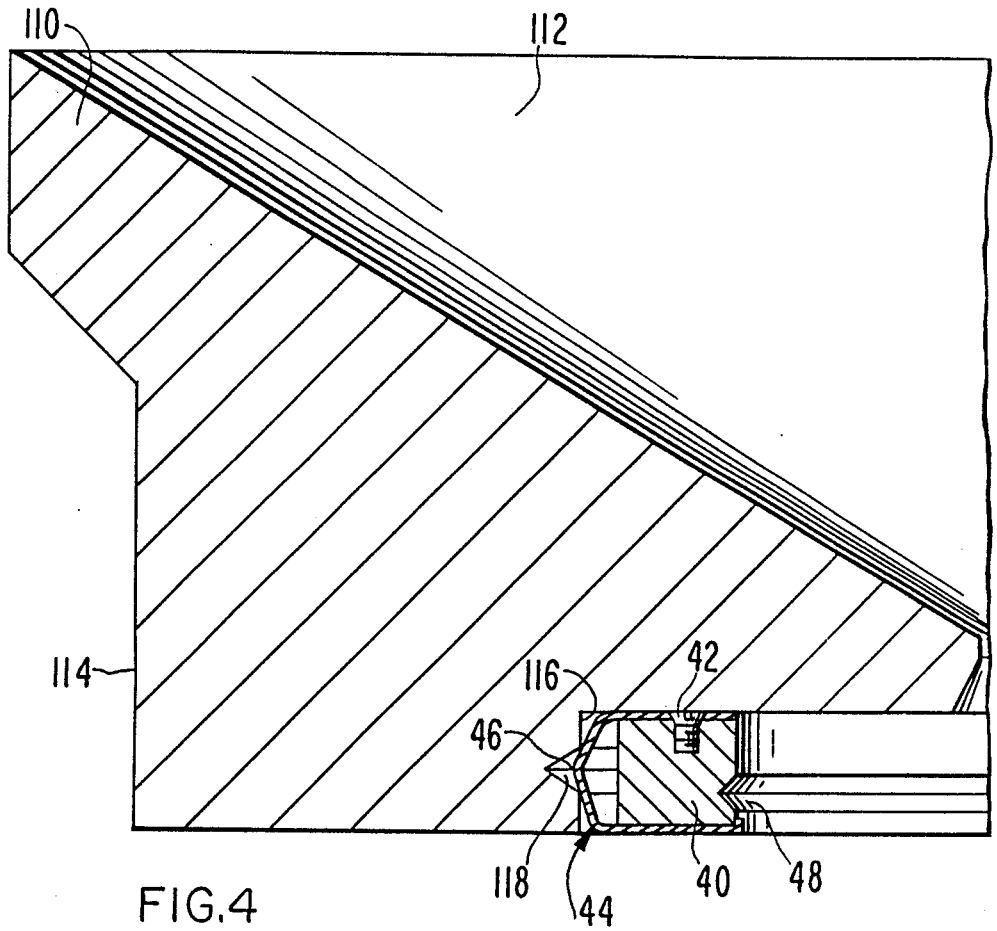
FIG. 4 is a partial section of one embodiment of the present invention.

FIG. 3 shows a modified sputter target 110 designed for use with the adapter ring of FIG. 2. As compared to the sputter target 10 shown in FIG. 1, the inner rim 116 of the modified target is further recessed, i.e., is located more radially outward relative to the central axis of the source, to provide room for the adapter ring 40. FIG. 4 shows how target 110 and adapter ring 40 cooperate to provide a quick change target structure. When sputter target 110 is in place in the sputter source 5, protrusion 46 of spring 44 rests firmly in V-groove 118 in target inner rim 116. The gripping force exerted by spring 44 is sufficient to hold target 110 securely in place. However, by exerting sufficient axial force on target 110 one can overcome the force provided by spring 44 and cause the target to move in an axial direction. Thus, sputter target 110 can be removed and replaced by the application of axial force, allowing such replacement to be accomplished much more quickly.

Adapter ring 40 is removable from the source if it is desired to return to the old mounting means, for example to use up a supply of prior art sputter targets.

Figure 5:
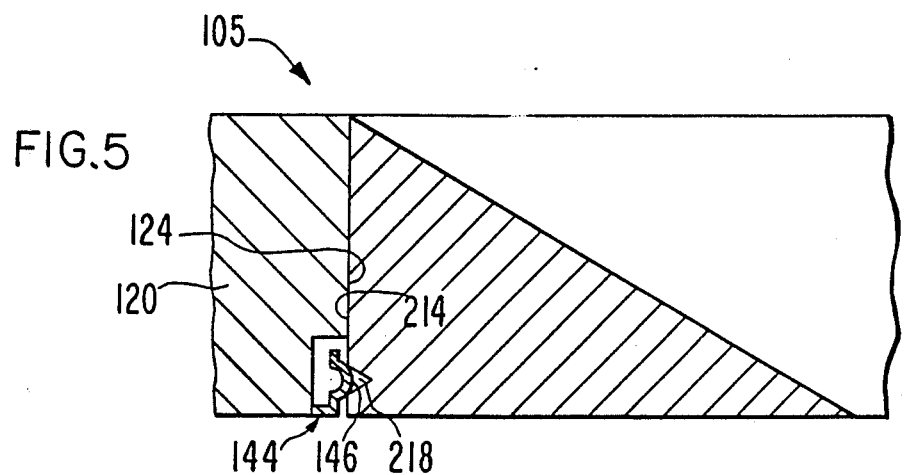
FIG. 5 is a partial section of an alternate embodiment of the present invention.

While the invention has been described in the context of an adapter ring 40 which is particularly useful for retrofitting existing sources to provide a quick change target structure, it is clear that a source could incorporate springs for gripping the sputter target without an adapter ring. An example of such a source, showing an alternate embodiment of the present invention is shown in FIG. 5. The FIG. 5 embodiment not only shows a structure having springs 144 of an alternate design which are part of the sputter source 105 as constructed, it also shows that V-groove 218 can be made a part of the outer target rim 214. This approach has the minor disadvantage that it slightly diminishes the surface area of the cooling wall 124 which contacts outer rim 214.

While FIGS. 2, 3, 4, and 5 show the use, in preferred embodiments of the invention, of protrusions 46 and 146 having circular cross section, and V-grooves 48, 118, and 218, other configurations are easily substituted and should be considered within the scope of the present invention. For example, the circular cross section of protrusions 46 and 146 could be replaced by a shape having a substantially triangular cross section. Likewise, the V-grooves 48, 118, and 218 could be replaced by slightly sloping surfaces similar to the inner rim 16 shown in FIG. 1. Moreover, ball springs could easily be used instead of the types of springs shown in FIGS. 2, 4 and 5. However, ball springs are thought to be less desirable because they are more likely to introduce contamination into the sputtering system. Likewise, the protrusions of springs 44 could be of generally circular cross section rather than the substantially triangular cross section shown in FIGS. 2 and 4.

The preceding description and accompanying drawings are intended to be illustrative of the invention and not limiting. Various other modifications and applications will be apparent to those skilled in the art without departing from the true spirit and scope of the invention as defined by the following claims.

What is claimed is:

1. A sputter source having a quick change target from which material is sputtered comprising:
   a removable, annularly shaped, target from which material is sputtered, said target having an outer rim;
   an annular cooling wall adjacent to said outer rim of said sputter target;
   the diameter of said sputter target being dimensioned such that the sputter target fits loosely within said cooling wall when said sputter target is at a temperature substantially below its normal operating temperature so that the target is easily inserted and removed from said source when it is substantially below its normal operating temperature and such that said sputter target tightly contacts said cooling wall when the target is heated to its normal operating temperature, so that good thermal contact is maintained between said cooling wall and said sputter target when said source is in operation;
   spring means for releasably gripping said target so that said target is held in place adjacent to said cooling wall while said cooling wall is substantially below its normal operating temperature, said spring means being actuated by axial force on said sputter target whereby by said sputter target can be inserted and removed from said spring means by said axial force.

2. The sputter source of claim 1 further comprising an inner rim of said annular target, said inner rim being adapted to function in cooperation with said spring means.

3. The sputter source of claim 2 wherein said inner rim comprises an annular V-groove and said spring means comprises a plurality of members which resiliently grip said V-groove when said sputter target is inserted in said source.

4. The sputter source of claim 3 wherein each of said members comprises a spring-loaded protruding surface which extends into said V-groove when said sputter target is inserted into said sputter source.

5. The sputter source of claim 3 wherein each of said members comprises a spring having a protrusion at least a portion of which rests within said V-groove when said sputter target is inserted into said sputter source.

6. The sputter source of claim 5 wherein said protrusion has a substantially circular cross section.

7. The sputter source of claim 5 wherein said protrusion has a substantially triangular cross section.

8. A sputter source having a quick change target from which material is sputtered comprising:
   a removable, annualarly shaped target from which material is sputtered said target having an outer rim at the perimeter thereof, at least a portion of said target outer rim being substantially parallel to the axis of said source, and an inner rim;
   an annular cooling wall adjacent to said outer rim of said sputter target, a portion of said cooling wall being substantially parallel to the axis of said source and corresponding to the target outer wall portion;
   the diameter of said sputter target being dimensioned such that the sputter target fits loosely within the volume defined by said annular cooling wall when said sputter target is at a temperature substantially below its normal operating temperature, and such that said sputter target tightly contacts said cooling wall when the target is heated to its normal operating temperature, so that good thermal contact is maintained between said cooling wall and said sputter target when the source is in operation and such that the target is easily inserted and removed from said source when it is substantially below its normal operating temperature;
   gripping means for releasably gripping said inner target rim so that said target is held in place adjacent to said cooling wall while said cooling wall is substantially below its normal operating temperature, said gripping means being actuated by axial force on said sputter target whereby by said sputter target can be inserted and removed from said gripping means by said axial force.

9. A sputter source having a quick change target from which material is sputtered comprising:
   a removable, annularly shaped, target from which material is sputtered said target having an outer rim at the perimeter thereof, at least a portion of said target outer rim being substantially parallel to the axis of said source, said outer rim comprising a V-groove;
   an annular cooling wall adjacent to said outer rim said sputter target, a portion of said cooling wall being substantially parallel to the axis of said source and corresponding to the target outer wall portion;
   the diameter of said sputter target being dimensioned such that the sputter target fits loosely within the volume defined by said annular cooling wall when said sputter target is at a temperature substantially below its normal operating temperature, and such that said sputter target tightly contacts said cooling wall when the target is heated to its normal operating temperature so that good thermal contact is maintained between said cooling wall and said sputter target when the source is in operation and such that the target is easily inserted and removed from said source when it is substantially below its normal operating temperature;
   gripping means for releasably gripping said outer target rim groove so that said target is held in place adjacent to said cooling wall while said cooling wall is substantially below its normal operating temperature, said gripping means being actuated by axial force on said sputter target whereby by said sputter target can be inserted and removed from said gripping means by said axial force.

10. An adapter ring for use in a sputter source, whereby said sputter source is modified to permit the use of quick change sputter targets, comprising:
   an annular ring having an outer rim and an inner rim, said inner rim including means for removable mounting of said ring in said sputter source in the same manner as a sputter target of the type normally utilized in the sputter source;
   said outer rim having spring gripping means for releasably gripping and holding a modified sputter target in place adjacent to a sputter source cooling means, said spring gripping means being actuated by axial force on said sputter target whereby by said sputter target can be inserted and removed from said spring gripping means by said axial force.

11. The adapter ring of claim 10 wherein said spring gripping means comprises a plurality of springs.

12. The adapter ring of claim 11 wherein said spring gripping means comprise protrusions adapted to sit within a V-groove in an inner rim of said sputter target.

* * * * *

UNITED STATES PATENT AND TRADEMARK OFFICE
CERTIFICATE OF CORRECTION

PATENT NO. : 4,820,397
DATED : April 11, 1989
INVENTOR(S) : Kenneth B. Fielder et al It is certified that error appears in the above–identified patent and that said Letters Patent is hereby corrected as shown below:

Claim 8, line 57, "annualarly" should be --annularly--.
Claim 8, line 58, insert --,-- after "sputtered".
Claim 9, line 20, insert --,-- after "sputtered".
Claim 9, line 26, "said sputter target" should be
　　　　　　　　--of said sputter target--.

Signed and Sealed this

Thirty-first Day of October, 1989

Attest:

DONALD J. QUIGG

Attesting Officer

Commissioner of Patents and Trademarks